United States Patent
Luo et al.

(10) Patent No.: US 11,640,932 B2
(45) Date of Patent: *May 2, 2023

(54) PACKAGED ELECTRONIC DEVICE WITH FILM ISOLATED POWER STACK

(71) Applicant: TEXAS INSTRUMENTS INCORPORATED, Dallas, TX (US)

(72) Inventors: Tianyi Luo, Bethlehem, PA (US); Jonathan Almeria Noquil, Bethlehem, PA (US); Osvaldo Jorge Lopez, Annandale, NJ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/318,974

(22) Filed: May 12, 2021

(65) Prior Publication Data

US 2021/0265246 A1    Aug. 26, 2021

Related U.S. Application Data

(62) Division of application No. 16/445,836, filed on Jun. 19, 2019, now Pat. No. 11,024,564.

(51) Int. Cl.
*H01L 23/495* (2006.01)
*H01L 25/07* (2006.01)
(Continued)

(52) U.S. Cl.
CPC .... *H01L 23/49513* (2013.01); *H01L 21/4828* (2013.01); *H01L 21/565* (2013.01);
(Continued)

(58) Field of Classification Search
CPC .......... H01L 23/49513; H01L 21/4828; H01L 21/565; H01L 23/3121; H01L 23/49537; H01L 23/49548; H01L 23/49562; H01L 23/49575; H01L 23/49586; H01L 24/27; H01L 24/29; H01L 24/32; H01L 24/83; H01L 25/074; H01L 25/50; H01L 2224/2731; H01L 2224/2919; H01L 2224/32245; H01L 2224/83192; H01L 2224/83815; H01L 2924/0665; H01L 2924/13091; H01L 24/73; H01L 24/84; H01L 24/92; H01L 24/37; H01L 24/40; H01L 2224/293; H01L 2224/37013; H01L 2224/37124; H01L 2224/37147; H01L 2224/40499; H01L 2224/92246;
(Continued)

(56) References Cited

U.S. PATENT DOCUMENTS 5,293,069 A    3/1994    Kato et al.
6,674,159 B1   1/2004    Peterson et al.
(Continued)

*Primary Examiner* — David Vu
(74) *Attorney, Agent, or Firm* — Ronald O. Neerings; Frank D. Cimino

(57) ABSTRACT

A packaged electronic device includes a stacked configuration of a first semiconductor die in a first recess in a first side of a first conductive plate, a second semiconductor die in a second recess in a first side of a second conductive plate, a third conductive plate electrically coupled to a second side of the second semiconductor die, and a package structure that encloses the first semiconductor die, and the second semiconductor die, where the package structure includes a side that exposes a portion of a second side of the first conductive plate.

20 Claims, 10 Drawing Sheets

(51) Int. Cl.
*H01L 23/31* (2006.01)
*H01L 21/48* (2006.01)
*H01L 23/00* (2006.01)
*H01L 25/00* (2006.01)
*H01L 21/56* (2006.01)

(52) U.S. Cl.
CPC .... *H01L 23/3121* (2013.01); *H01L 23/49537* (2013.01); *H01L 23/49548* (2013.01); *H01L 23/49562* (2013.01); *H01L 23/49575* (2013.01); *H01L 23/49586* (2013.01); *H01L 24/27* (2013.01); *H01L 24/29* (2013.01); *H01L 24/32* (2013.01); *H01L 24/83* (2013.01); *H01L 25/074* (2013.01); *H01L 25/50* (2013.01); *H01L 2224/2731* (2013.01); *H01L 2224/2919* (2013.01); *H01L 2224/32245* (2013.01); *H01L 2224/83192* (2013.01); *H01L 2224/83815* (2013.01); *H01L 2924/0665* (2013.01); *H01L 2924/13091* (2013.01)

(58) Field of Classification Search
CPC ..... H01L 2924/181; H01L 2224/27312; H01L 24/33; H01L 23/3107; H01L 25/03; H01L 2224/2732; H01L 2224/29006; H01L 2224/2929; H01L 2224/33181; H01L 2224/40175; H01L 2224/73263; H01L 2224/83191; H01L 2224/83862; H01L 2224/84862; H01L 2924/15153; H01L 23/13; H01L 23/49833; H01L 23/5389; H01L 25/117; H01L 23/49861

See application file for complete search history.

(56) References Cited

U.S. PATENT DOCUMENTS

| | | |
|---|---|---|
| 9,305,852 B1 | 4/2016 | Lopez et al. |
| 9,935,041 B1 | 4/2018 | Lopez et al. |
| 2005/0093093 A1 | 5/2005 | Burke et al. |
| 2009/0189291 A1 | 7/2009 | Landau et al. |
| 2011/0074007 A1 | 3/2011 | Lopez et al. |
| 2014/0210064 A1 | 7/2014 | Lopez et al. |
| 2014/0306332 A1 | 10/2014 | Denison et al. |
| 2015/0221622 A1 | 8/2015 | Lopez et al. |
| 2016/0133535 A1 | 5/2016 | Lopez et al. |
| 2016/0133616 A1 | 5/2016 | Lopez et al. |
| 2017/0047229 A1 | 2/2017 | Lu et al. |
| 2017/0229435 A1 | 8/2017 | Noquil et al. |
| 2018/0190573 A1 | 7/2018 | Mullenix et al. |

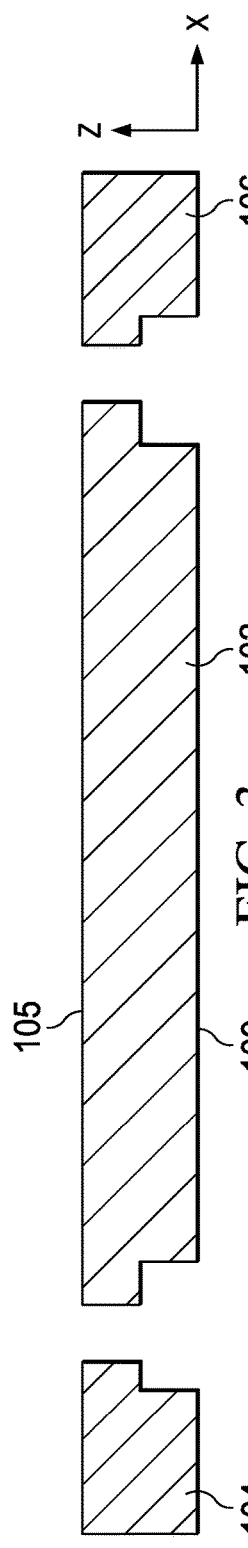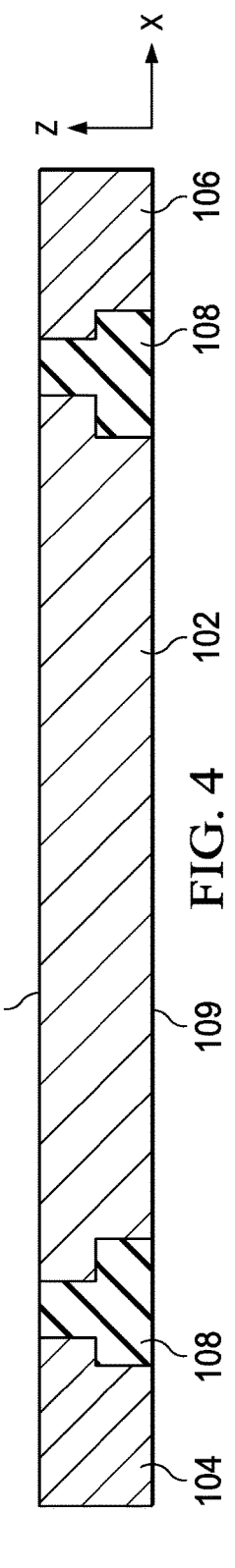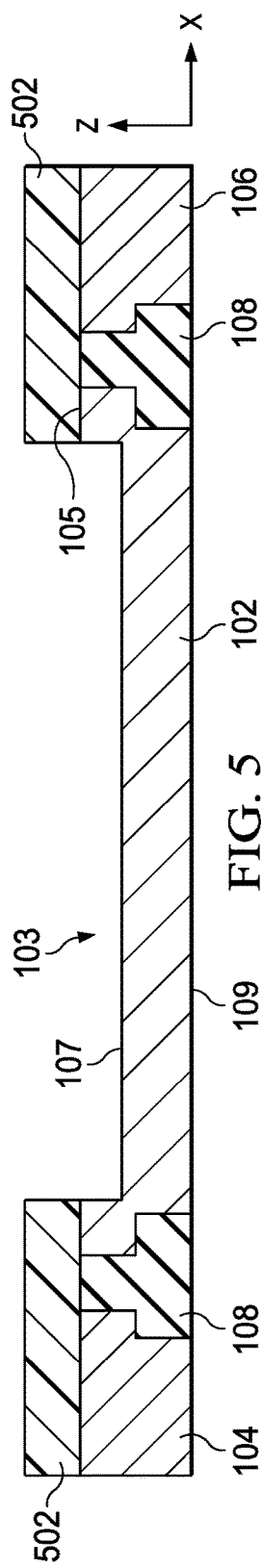

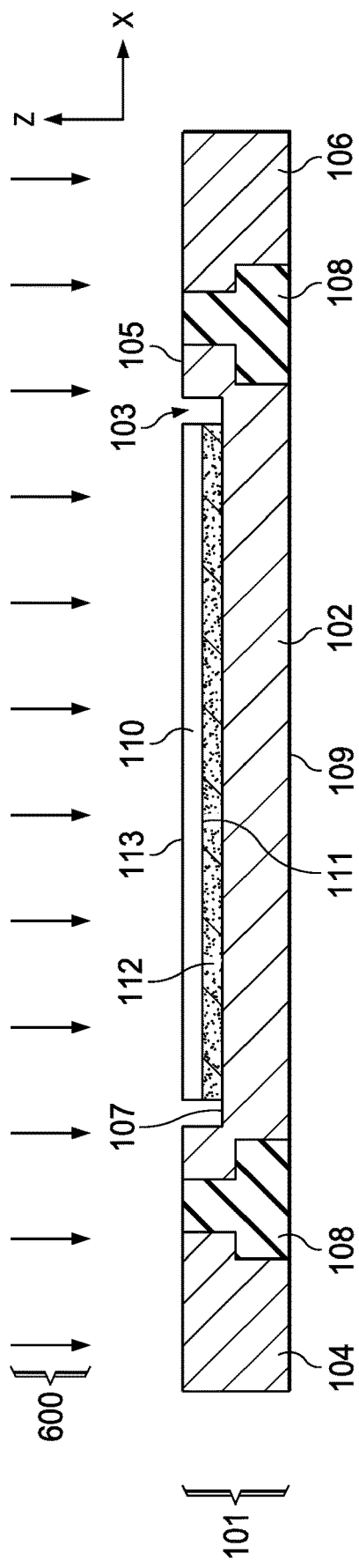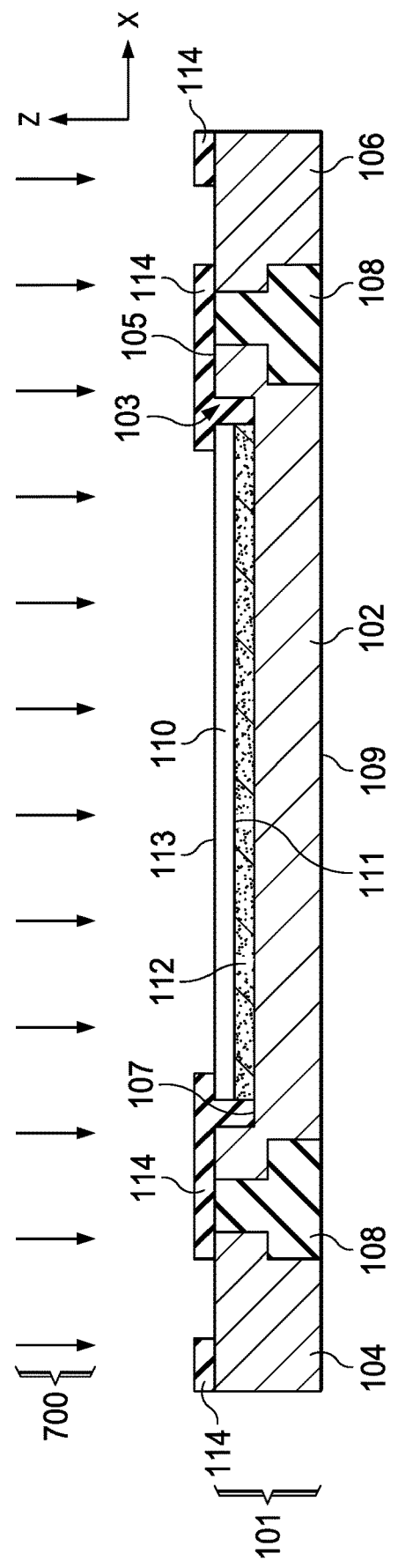

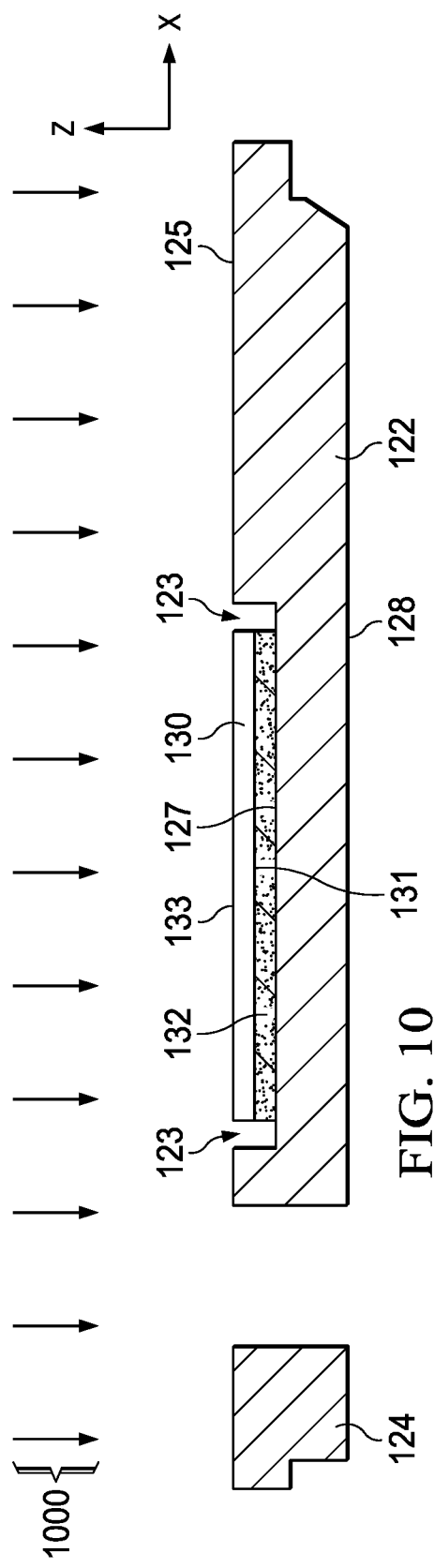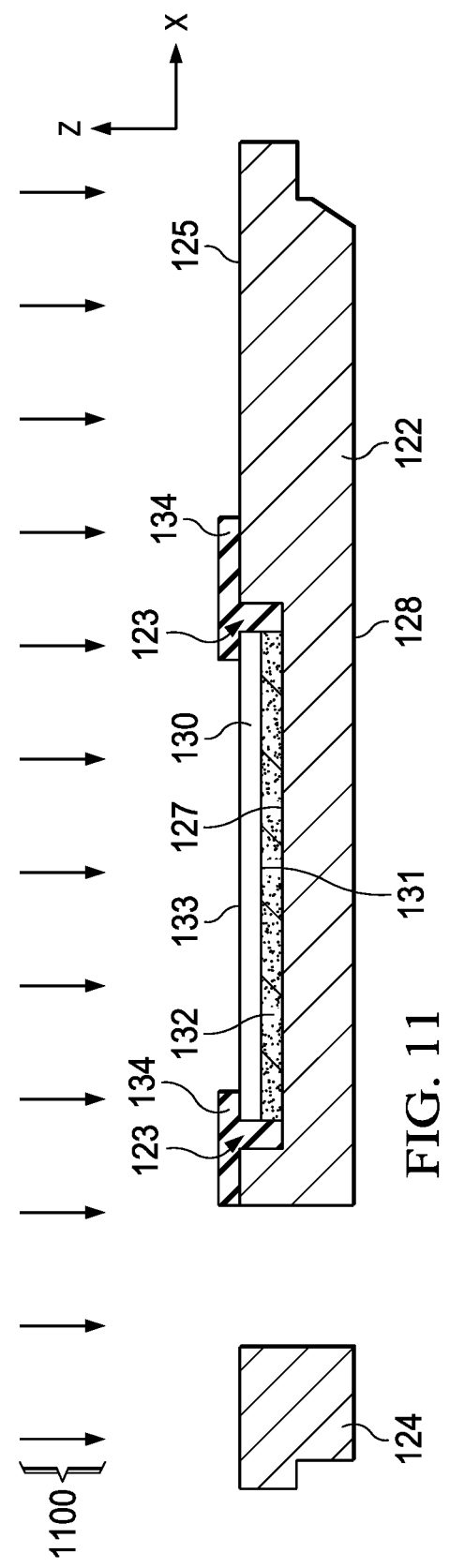

PACKAGED ELECTRONIC DEVICE WITH FILM ISOLATED POWER STACK

This application is a Divisional of application Ser. No. 16/445,836 filed Jun. 19, 2019.

BACKGROUND

Switching power supplies typically use a half bridge configuration of a high side transistor switching device and a low side transistor switching device, for example, to implement a DC-DC buck converter or a boost converter. Other power supply configurations include a full bridge with two sets of high and low side switches. Power stacks include a stacked configuration of semiconductor dies with respective high and low side switching transistors. Conductive clips interconnect the stacked semiconductor dies and are formed to provide bottom side pads for soldering to a host printed circuit board (PCB). The clips and semiconductor dies are connected using conductive epoxy or solder paste to electrically interconnect the transistors in a switching circuit configuration. Recently, lead-free conductive epoxy resin has been used in green die attach processes to interconnect semiconductor dies and formed conductive clips to address environmental concerns. Clip packages provide high current carrying capability for switching supplies and other applications, but green die attachment to dies suffers from implementation difficulties and poor reliability due to lead-free epoxy bleed out. For example, lead-free (Pb-free) epoxy resin can bleed out laterally when a formed upper clip is attached to the top of a high side transistor die. The bleed out of the conductive epoxy can extend down a sidewall of the die, potentially leading to leakage or even short-circuiting of the high side transistor. In addition, formed conductive clips require extra tooling and manufacturing steps, thereby increasing product cost. Environmentally favorable alternatives include flip-chip packaging or alternative lead-free material, such as pure tin (Sn), tin-copper, high silver (Ag) epoxy, etc., but flip-chip packages increase the footprint or circuit board area occupied by the half bridge switching circuit, and such alternative materials increase production costs.

SUMMARY

A described packaged electronic device includes a first semiconductor die in a first recess in a first side of a first conductive plate, and a second semiconductor die in a second recess in a first side of a second conductive plate. A third conductive plate is electrically coupled to a second side of the second semiconductor die. A package structure encloses the first and second semiconductor dies, and includes a side that exposes a portion of a second side of the first conductive plate.

An example packaged switching circuit includes a first semiconductor die with a first transistor having a first source terminal, a first drain terminal, and a first gate terminal. The first semiconductor die includes a first side electrically coupled to the first source terminal and to a first bottom of a first recess of a first conductive plate, and an opposite second side electrically coupled to the first drain terminal and to a second conductive plate. The packaged switching circuit includes a second semiconductor die with a second transistor having a second source terminal, a second drain terminal, and a second gate terminal. The second semiconductor die also includes a first side electrically coupled to the second source terminal and to a second bottom of a second recess of the second conductive plate. The second semiconductor die also includes a second side electrically coupled to the second drain terminal and to a first side of a third conductive plate. The packaged switching circuit also includes a first conductive pad electrically coupled to the third conductive plate, a second conductive pad electrically coupled to the second conductive plate, a third conductive pad electrically coupled to the first gate terminal, and a fourth conductive pad electrically coupled to the second gate terminal. A package structure encloses the first semiconductor die, and the second semiconductor die. The package structure includes a side that exposes respective portions of the conductive pads and the second side of the first conductive plate.

An example method includes forming a first recess in a first side of a first conductive plate, forming a first conductive epoxy on a first bottom of the first recess, attaching a first side of a first semiconductor die to the first conductive epoxy to electrically couple the first side of the first semiconductor die to the first bottom of the first recess of the first conductive plate, and forming a first intermediate conductive epoxy on a second side of the first semiconductor die. The method also includes forming a second recess in a first side of a second conductive plate, forming a second conductive epoxy on a second bottom of the second recess, attaching a first side of a second semiconductor die to the second conductive epoxy to electrically couple the first side of the second semiconductor die to the second bottom of the second recess of the second conductive plate, attaching a second side of the second conductive plate to the first intermediate conductive epoxy to electrically couple the second side of the second conductive plate to the second side of the first semiconductor die, and forming a second intermediate conductive epoxy on a second side of the second semiconductor die. The method further includes attaching a first side of a third conductive plate to the second intermediate conductive epoxy to electrically couple the first side of the third conductive plate to the second side of the second semiconductor die, and performing a molding process that forms a package structure that encloses the first semiconductor die, and the second semiconductor die, the package structure including a first side that exposes a portion of the second side of the first conductive plate.

BRIEF DESCRIPTION OF THE DRAWINGS

FIGS. 3-14 are partial sectional side elevation views of the example packaged electronic device of FIG. 1 undergoing fabrication processing according to the method of FIG. 2.

DETAILED DESCRIPTION

Figure 1:
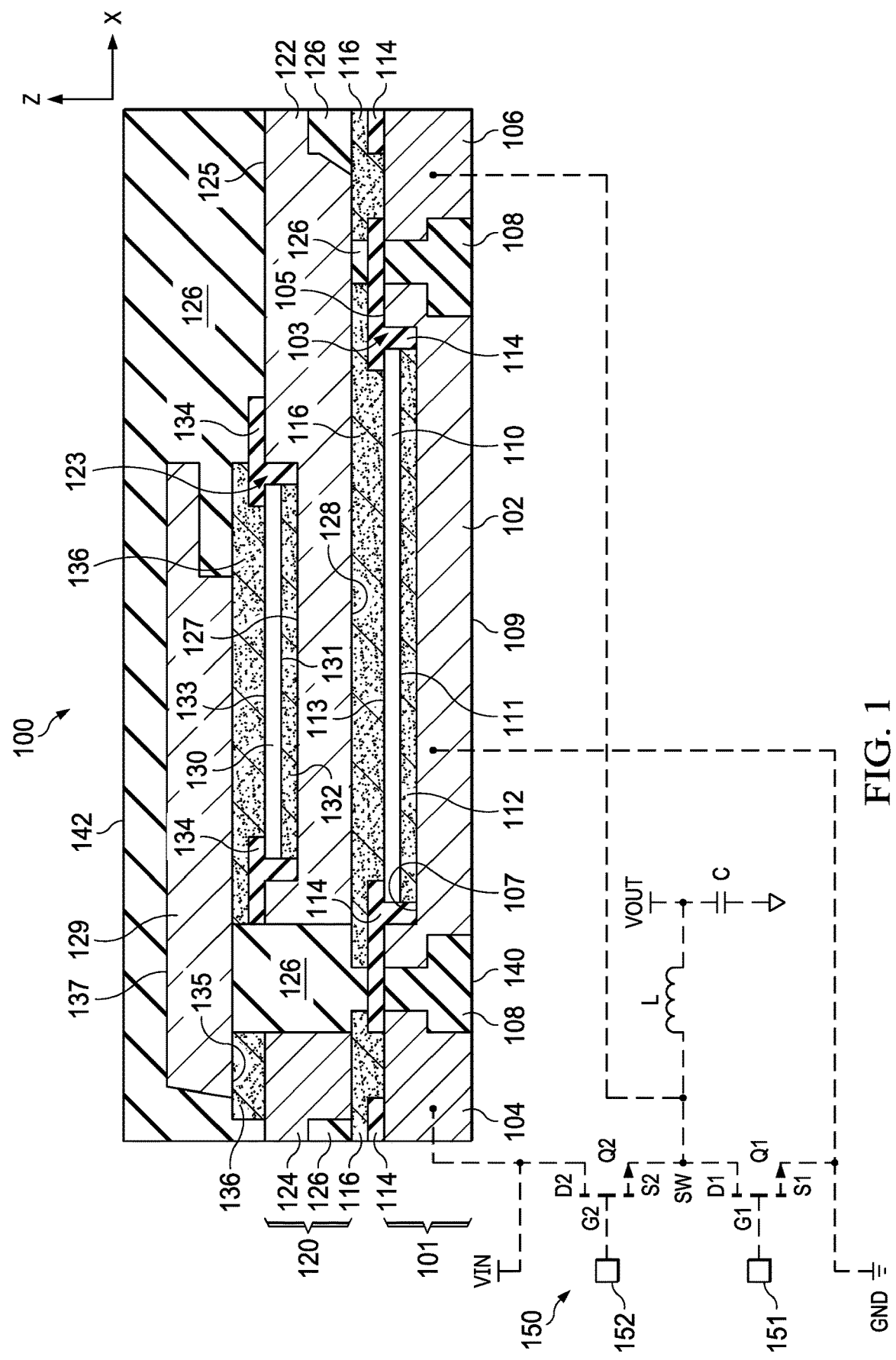
FIG. 1 is a partial sectional side elevation view of a packaged electronic device.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the terms "coupled, "couple", and/or or "couples" is/are intended to include indirect or direct electrical or mechanical connection or combinations thereof. For example, if a first device couples to or is electrically coupled with a second device that connection may be through a direct electrical connection, or through an indirect electrical connection via one or more intervening devices and/or connections.

FIG. 1 shows a partial side section view of a packaged electronic device 100. The packaged electronic device 100 includes a first subassembly 101, having a first conductive plate 102 (e.g., copper or aluminum) with a first recess 103 (e.g., a slot). In one example, apart from the recess 103, the first conductive plate 102 is a generally flat metallic structure. The first subassembly 101 also includes a first conductive pad 104 (e.g., copper or aluminum) with a top side generally coplanar with a first side 105 of the first conductive plate 102, as well as a second conductive pad 106 (e.g., copper or aluminum). The bottom of the example packaged electronic device 100 is a planar structure to be soldered to a planar host PCB (not shown). The recess 103 extends into the first side 105 of the first conductive plate 102 (e.g., along the negative Z direction in FIG. 1) and includes a first bottom 107. The bottom of the example packaged electronic device 100 includes exposed portions of the first conductive plate 102, the first conductive pad 104, and the second conductive pad 106, separated by an electrically insulating packaging material 108 (e.g., molded plastic). The first conductive plate 102 includes the first side 105 (e.g., the top side along the Z axis in FIG. 1) as well as an opposite second side 109 (e.g., the bottom side in FIG. 1). In one example, the first conductive plate 102 is a copper or aluminum die attach pad of a starting leadframe structure held in place during fabrication on an adhesive carrier (not shown) in a controlled spatial relationship to the conductive pads 104 and 106.

A first semiconductor die 110 is positioned at least partially in the first recess 103. The first semiconductor die 110 includes a first side 111 (e.g., the bottom side in FIG. 1) that is electrically coupled to the first bottom 107 of the first recess 103. A first conductive epoxy 112 is located in the first recess 103 between the first side 111 of the first semiconductor die 110 and the first bottom 107 of the first recess 103. In one example, the first conductive epoxy 112 is a lead-free epoxy. The first conductive epoxy 112 electrically couples at least a portion of the first side 111 of the first semiconductor die 110 to the first bottom 107 of the first recess 103. In one example, the first semiconductor die 110 includes one or more conductive features (e.g., die pads) on the first side 111 that is or are electrically coupled to the first bottom 107 of the first recess 103 via at least a portion of the first conductive epoxy 112 in the recess 103. The first semiconductor die 110 also includes an opposite second side 113 (e.g., the top side in FIG. 1). A first electrically insulating film 114 is located at least partially in the first recess 103, and extends at least partially along a sidewall and a portion of the second side 113 of the first semiconductor die 110. Some examples of materials for the first electrically insulating film 114 and other electrically insulating films of various implementations include dry films or liquid photo-imageable films, solder mask photo resist, polyimide materials (e.g., also photo-imageable and can remove unpolymerized material after application, for example, to make a pattern for isolation), and ABF films. A first intermediate conductive epoxy 116 is located on the second side 113 of the first semiconductor die 110. In one example, the first intermediate conductive epoxy 116 is a lead-free epoxy. The first intermediate conductive epoxy 116 electrically couples the second side 128 of the second conductive plate 122 to the second side 113 of the first semiconductor die 110.

The packaged electronic device 100 includes a second subassembly 120 located on the and above the first subassembly 101. The second subassembly 120 includes a second conductive plate 122 (e.g., copper or aluminum) with a second recess 123, as well as a conductive structure 124 that is electrically isolated from the second conductive plate 122. In one example, apart from the second recess 123, the second conductive plate 122 is a generally flat metallic structure. The second recess 123 is formed in a first side 125 (e.g., the top side in FIG. 1) of the second conductive plate 122. The second subassembly 120 also includes an electrically insulating packaging material 126 (e.g., molded plastic) that separates and electrically isolates the second conductive plate 122 from the conductive structure 124. The second recess 123 includes a second bottom 127 that extends downward into the first side 125 toward an opposite second side 128 of the second conductive plate 122.

A third conductive plate 129 electrically couples a second semiconductor die 130 to the conductive structure 124. In one example, the third conductive plate 129 is a generally flat metallic structure (e.g., copper or aluminum). The second semiconductor die 130 includes a first side 131 (e.g., the bottom side in FIG. 1). The first side 131 of the second semiconductor die 130 is electrically connected to the second bottom 127 of the second conductive plate 122 via a second conductive epoxy 132. In one example, the second conductive epoxy 132 is a lead-free epoxy. The second conductive epoxy 132 is located in the second recess 123 between the first side 131 of the second semiconductor die 130 and the second bottom 127 of the second conductive plate 122. The second semiconductor die 130 includes the first side 131 and an opposite (e.g., top) second side 133 electrically coupled to the third conductive plate 129. A second electrically insulating film 134 is located at least partially in the second recess 123 along a sidewall of the second semiconductor die 130. The third conductive plate 129 includes a bottom side 135 electrically coupled to the second side 133 of the second semiconductor die 130. A second intermediate conductive epoxy 136 is located on the second side 133 of the second semiconductor die 130 to electrically couple the bottom side 135 of the third conductive plate 129 to the second side 133 of the second semiconductor die 130. In one example, the second intermediate conductive epoxy 136 is a lead-free epoxy. The third conductive plate 129 includes a second (e.g., top) side 137 covered by the packaging material 126.

The package structure 108, 126 in one example is a molded plastic material that encloses the first semiconductor die 110, and the second semiconductor die 130. The package structure 108, 126 includes a first side 140 (e.g., a bottom side in FIG. 1) that exposes a portion of the second side 109 of the first conductive plate 102, and an opposite (e.g., top) side 142. The molded package structure 108, 126 in one example is a really rectangular structure, although not a requirement of all possible implementations. Other electrically insulating materials can be used, preferably having high thermal conductivity to facilitate cooling of the first and second semiconductor dies 110 and 130, respectively. The first conductive pad 104 is electrically coupled to the third conductive plate 129 through the first intermediate conductive epoxy 116, the conductive structure 124, and the second intermediate conductive epoxy 136. The third conductive plate 129, in turn, is electrically coupled to the second side 133 of the second semiconductor die 130 through the associated portion of the second intermediate conductive epoxy 136. The structure forms an electrical connection between the second side 133 of the second semiconductor die and the first conductive pad 104. In one example, this electrical connection provides an input voltage connection for a buck converter implementation as described further below.

In the example packaged electronic device 100, the second conductive pad 106 is electrically coupled to the second conductive plate 122 through the associated portion of the first intermediate conductive epoxy 116. The second conductive plate 122 is electrically coupled to the first side 131 of the second semiconductor die 130 through the second conductive epoxy 132, and also to the second side 113 of the first semiconductor die 110 through the first intermediate conductive epoxy 116. This structure forms an electrical connection between the first side 131 of the second semiconductor die 130 and the second side 113 of the first semiconductor die 110, and the second conductive pad 106. In one example, this electrical connection provides a switching node connection for the example buck converter described further below. The example packaged electronic device 100 also provides an electrical connection of the first bottom 107 of the first recess 103 of the first conductive plate 102 to the first side 111 of the first semiconductor die 110 through the first conductive epoxy 112. This electrical connection provides a ground or reference voltage node connection for the example buck converter described below. In the illustrated example, the package structure 108, 126 exposes a portion of the lower side of the first conductive pad 104, and the package structure 108, 126 exposes a portion of the lower side of the second conductive pad 106. In this manner, the packaged electronic device 100 provides a packaged switching circuit (e.g., a stacked power module) that can be soldered to a host PCB (not shown) together with external components to form a switching DC-DC converter, such as a buck converter, a boost converter, a cuk converter, a buck-boost converter, etc.

FIG. 1 also shows a schematic representation of one example interconnection of the conductive features of the first conductive plate 102, the first conductive pad 104 and the second conductive pad 106 to form a buck DC-DC converter 150. In this example, the packaged electronic device 100 provides a packaged switching circuit 100 with a stacked configuration of NMOS high and low side switching transistors Q1 and Q2, respectively. In this example, the transistors Q1 and Q2 are respectively located in the corresponding first and second semiconductor dies 110 and 130 and the device 100 connects the transistors Q1 and Q2 in a half bridge circuit.

Figure 15:
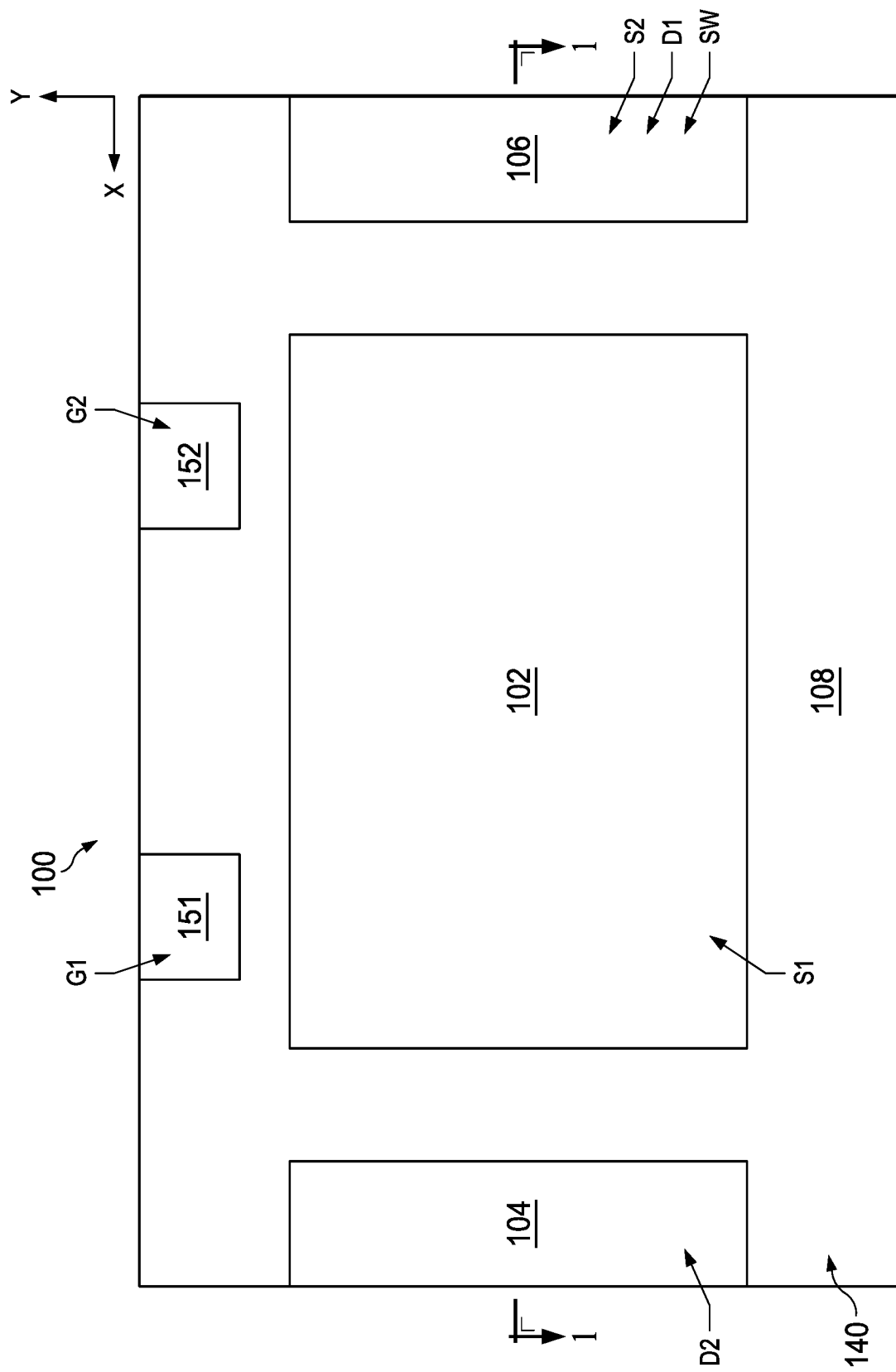
FIG. 15 is a bottom view of the package electronic device of FIG. 1.

The first semiconductor die 110 includes the first transistor Q1, with a first source terminal S1 connected to a ground reference node GND of the buck converter 150, a first drain terminal D1 connected to a switching node SW, and a first gate terminal G1 connected to a first gate control terminal 151. In the packaged electronic device 100 of FIG. 1, the first side 111 (e.g., bottom) of the first semiconductor die 110 is electrically coupled to the first source terminal S1 and to the first bottom 107 of the first recess 103 of the first conductive plate 102. The lower second side 109 of the first conductive plate 102 in this example can be soldered to a circuit board ground connection of a host PCB (not shown) as schematically shown in dashed line in FIG. 1. The upper second side 113 of the first semiconductor die 110 is electrically coupled to the first drain terminal D1 and to the second conductive plate 122 through the first intermediate conductive epoxy 116. The second conductive plate 122 forms the buck converter switching node SW and connects the first drain terminal D1 to the second conductive pad 106 through the associated portion of the first intermediate conductive epoxy 116. In one example, the second side 113 of the first semiconductor die 110 includes a second die pad or other conductive feature (not shown) that connects the first gate terminal G1 to the first gate control terminal 151 exposed along the bottom side 140 of the device 100, as shown in FIG. 15 below, to allow connection to a gate driver circuit of a host PCB (not shown).

The second semiconductor die 130 includes the second transistor Q2, with a second source terminal S2, a second drain terminal D2, and a second gate terminal G2. The first side 131 of the second semiconductor die 130 includes a conductive feature connected to the second source terminal S2, which is electrically coupled to the second bottom 127 of the second recess 123 of the second conductive plate 122 at the switching node SW through the second conductive epoxy 132. The second side 133 of the second semiconductor die 130 includes a die pad or other conductive feature that is electrically coupled to the second drain terminal D2, and is connected to the first side 135 of the third conductive plate 129 through the second intermediate conductive epoxy 136. In one example, the upper second side 133 of the second semiconductor die 130 also includes a second die pad or other conductive feature (not shown), that connects the second gate terminal G2 through another conductive plate (not shown) to the second gate control terminal 152 exposed along the bottom side 140 of the device 100, as shown in FIG. 15 below, to allow connection to a second gate driver circuit of a host PCB (not shown).

The packaged electronic device 100 provides a packaged switching circuit that includes bottom side pads and features which can be soldered to a host PCB along with the inductor L and the capacitor C to form the buck converter circuit 150 in FIG. 1. The packaged electronic device 100 in this example includes the bottom side 109 of the first conductive plate electrically coupled to the first source S1, the first conductive pad 104 electrically coupled to the third conductive plate 129 for the input voltage node VIN connection, the second conductive pad 106 electrically coupled to the second conductive plate 122 for the switching node SW connection, as well as the third conductive pad 151 (FIG. 15 below) electrically coupled to the first gate terminal G1, and the fourth conductive pad 152 (FIG. 15 below) electrically coupled to the second gate terminal G2. The package structure 108, 126 in this example encloses the first semiconductor die 110, and the second semiconductor die 130.

The first (e.g., bottom) side 140 of the package structure 108, 126 exposes respective portions of the first conductive pad 104, the second conductive pad 106, the third conductive pad 151 (FIG. 15 below), the fourth conductive pad 152 (FIG. 15 below), and the second side 109 of the first conductive plate 102 for soldering to a host PCB (not shown). A connected host PCB in one example includes an inductor L with a first terminal connected to the switching node SW (i.e., connected to the second conductive pad 106), and a second terminal connected to the output voltage node VOUT. The PCB also includes an output capacitor C with a first terminal connected to the output voltage node VOUT and a second terminal connected to an output common or reference node as schematically shown in FIG. 1 to create a buck DC-DC converter. A PWM controller and gate driver circuitry (not shown) provides a pulse width modulated switching control signals to the third and fourth conductive pads to operate the respective first and second transistors Q1 and Q2 in order to convert an input voltage VIN to a DC output voltage VOUT. In other implementations, the input voltage node, switching node and the ground reference node connections can be coupled in other circuit configurations to implement different types of DC-DC converter circuits (not shown). In another possible implementation, the package electronic device can include gate driver circuitry. In another example, the packaged electronic device includes gate driver circuits as well as a PWM circuit to generate the switching control signals according to a connected reference voltage and a feedback connection (not shown).

The various features of the example packaged electronic device 100 can be used to facilitate lead-free manufacturing processing for a variety of different circuit implementations. Stacked power switching circuits can be constructed with high current carrying capability (e.g., 80 A) through the use of conductive plates for interconnecting multiple semiconductor dies. Solder screen printing can be performed in fabricating the disclosed structures to facilitate manufacturability and processability. In one example, a film mask can be formed over the die 110 and/or 130, and the associated recess 103, 123 can be etched to provide a platform for printing or deposition of solder, epoxy, and/or an electrically insulating film solder. Various implementations can use either dry film or liquid film or combinations thereof. Dam and film encapsulants can be used in other examples.

The example packaged electronic device 100 of FIG. 1 advantageously includes the slots or recesses 103 and 123 which provide a protected cavity for lead-free die attach to prevent the possible leakage from lead-free epoxy resin overflow or bleed out. The recesses 103 and 123 can be used in combination with lead-free conductive epoxy and/or other conductive epoxies in different implementations. The example packaged electronic device 100 also includes electrically insulating films 114 and 134 in combination with the recesses 103 and 123. The recesses 103 and 123 facilitate the use of screen printing on the clip for better volume control of the conductive epoxies. In one example, the electrically insulating films 114 and 134 are formed as a thin layer of film mask to protect the die edges of the semiconductor dies 110 and 130 and prevent or mitigate epoxy overflow and associated short circuits. The electrically insulating films 114 and 134 also provide stress relief to the corner of die attach material in certain examples.

In addition, disclosed example packaged electronic device 100 includes unbent or flat conductive plates or clips, and thus reduce tooling and production costs associated with formed or bent clips. In addition, flat conductive plates facilitate reliability of the packaged electronic device 100, with reduced clip tilting to facilitate improved manufacturing yield. The flat conductive plates also facilitate planar assembly with uniform BLT and less tilting compared with power stack fabrication using clips. The example packaged electronic device 100 of FIG. 1 includes three flat conductive plates 102, 122 and 129, which reduces manufacturing cost and complexity. In another example, the second conductive plate 122 can be a formed structure that extends downward on the right in FIG. 1, with a lower surface generally coplanar with the bottom 140 of the packaged electronic device 100, and the second conductive pad 106 is omitted. In another example, the third conductive plate 129 can be a formed structure that extends downward on the left in FIG. 1, with a lower surface generally coplanar with the bottom 140 of the packaged electronic device 100, and the first conductive pad 104 is omitted.

Figure 2:
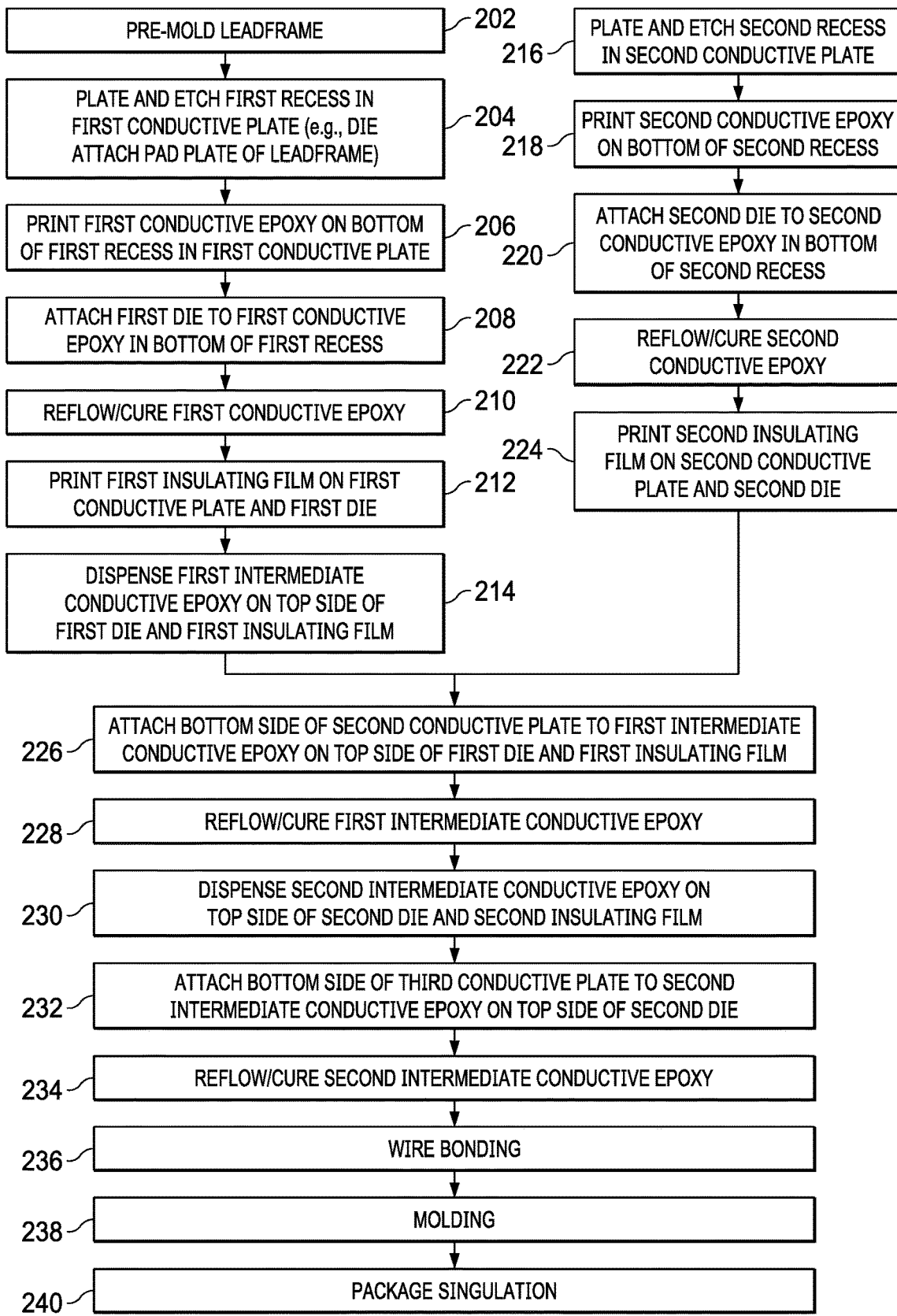
FIG. 2 is a flow diagram of a method for making a packaged electronic device.

FIGS. 2-14 illustrate an example fabrication process for manufacturing a packaged electronic device. FIG. 2 shows an example method 200, and FIGS. 3-14 illustrate the example packaged electronic device 100 of FIG. 1 undergoing fabrication according to the method 200. In the example method 200, the first subassembly 101 of FIG. 1 is fabricated at 202-214, and the second subassembly 120 is separately fabricated at 216-224, where the first and second subassembly processing can be performed independently, including concurrently. In other possible implementations, the fabrication of the second subassembly 120 is performed following fabrication of the first subassembly 101 in a continuous process (not shown).

The example method 200 begins with a starting leadframe structure. FIG. 3 shows one suitable example of a starting lead frame 104 made through stamping or other suitable fabrication processes using a suitable conductive material, such as copper. The example leadframe structure includes separated conductive structures 102 (lead frame die attach pad, referred to herein as the first conductive plate), 104 (first conductive pad) and 106 (second conductive pad). The conductive structures 102, 104 and 106 in one example are located in a predetermined spatial relationship to one another, for example, on an adhesive carrier tape (not shown). The method 200 includes pre-molding the lead frame structure at 202. FIG. 4 shows one suitable example, in which a molding process 400 is performed that forms the electrically insulating (e.g., nonconductive) packaging material 108 (e.g., molded plastic) that extends between the first conductive pad 104 and a first end of the first conductive plate 102, as well as between a second opposite end of the first conductive plate 102 and the second conductive pad 106. With the lead frame pre-molded as shown in FIG. 4, any previously used adhesive carrier tape can be removed for further processing.

The method 200 continues at 204 in FIG. 2 with plating the lead frame structure and forming a first recess in the first conductive plate. Any suitable plating process can be used to form a desired plated surface on the pre-molded lead frame structure at 204. In another example, the plating process is omitted, and the first recess is formed at 204. FIG. 5 shows one suitable example, in which a first etching process 500 is performed that etches the first recess 103 in the first side 105 of the first conductive plate 102 using a first mask 502. Any suitable etch process 500 and etching mask 502 can be used to form the first recess 103. In the illustrated example, the first bottom 107 of the first recess 103 is generally planar and the side walls of the recess 103 are generally vertical (e.g., along the Z axis in FIG. 5), although these characteristics are not strict requirements of all possible implementations. A generally flat bottom 107 facilitates subsequent processing to form (e.g., dispense, print, silkscreen, etc.) a conductive epoxy within the recess 103 and die attach processing to locate a semiconductor die at least partially within the recess 103 on the previously dispensed conductive epoxy.

The method 200 continues at 206 with forming a conductive epoxy on the first bottom of the first recess in the first conductive plate, followed by a die attach step at 208 to attach the first semiconductor die to the first conductive epoxy in the bottom of the first recess. FIG. 6 shows one suitable example, in which a printing and die attach process 600 is performed that prints the first conductive epoxy 112 on the first bottom 107 of the first recess 103. Any suitable printing equipment and techniques can be used. In another example, a dispensing process is used to form the conductive epoxy 112 on the first bottom 107 of the first recess 103. In another example, a screening process is used to form the conductive epoxy 112 on the first bottom 107 of the first recess 103. The example process 600 in FIG. 6 also includes attaching the first side 111 of the first semiconductor die 110 to the first conductive epoxy 112 (at 208 in FIG. 2). In one example, the processing 600 in FIG. 6 also includes a first thermal process that reflows the first conductive epoxy 112 (e.g., at 210 in FIG. 2) after attaching the first side 111 of the first semiconductor die 110 to the first conductive epoxy 112 at 208. In one example, the first conductive epoxy 112 is formed in a semi-solid state through dispensing, printing, silk screening, etc. Subsequent thermal processing at 210 in one example initially reflows the formed first conductive epoxy material 112 and the heating and/or subsequent cooling of the material 112 cures the first conductive epoxy 112 to a solid state that mechanically and electrically connects at least a portion of the lower first side 111 of the first semiconductor die 110 to the first conductive plate 102.

As previously discussed, the first side 111 of the first semiconductor die 110 can include a first conductive feature electrically connected to the first transistor source S1 (FIG. 1), as well as a second conductive feature electrically connected to the first gate terminal G1. In this example, the die attach processing can include contemporaneous dispensing, printing, etc. of the first conductive epoxy 112 in separate areas to accommodate electrically separated connections for the first source terminal S1 and the first gate terminal G1, such as forming a first portion of the first conductive epoxy 112 on a corresponding conductive pad 151 (e.g., FIGS. 1 and 15) for the first gate terminal connection, and forming a second portion of the first conductive epoxy 112 on at least a portion of the first bottom 107 of the first recess 103 of the first conductive plate 102 for the first source terminal connection as shown in FIGS. 3-14. In one example, the thermal process cures the first conductive epoxy 112. The die attach processing at 208 and 210 electrically couples at least a portion of the first side 111 of the first semiconductor die 110 to the first bottom 107 of the first recess 103 of the first conductive plate 102.

The method 200 continues at 212 with forming a first insulating film on portions of the first conductive plate and the first semiconductor die. Any suitable material formation processing can be used at 212, for example, printing, dispensing, silk screening, etc. FIG. 7 shows one example, in which a first deposition process, such as a printing process 700, is performed. The printing process 700 deposits the first electrically insulating film 114 at least partially in the first recess 103 along the sidewalls of the first semiconductor die 110 and along a laterally peripheral portion of the upper second side 113 of the first semiconductor die 110. In another example, the printing process 700 does not deposit the first electrically insulating film 114 on the upper second side 113 of the first semiconductor die 110. The illustrated example advantageously coats the peripheral edge of the upper second side 113 of the first semiconductor die 110, and helps to protect the die edges and prevent or mitigate epoxy overflow and associated short circuits in subsequent processing. In the example of FIG. 7, moreover, the process 700 forms the first electrically insulating film 114 on the peripheral edges of the second side 113, and leaves one or more upper conductive features of the first semiconductor die 110 exposed for subsequent electrical connection (e.g., the first drain terminal D1 in FIG. 1).

Figure 8:
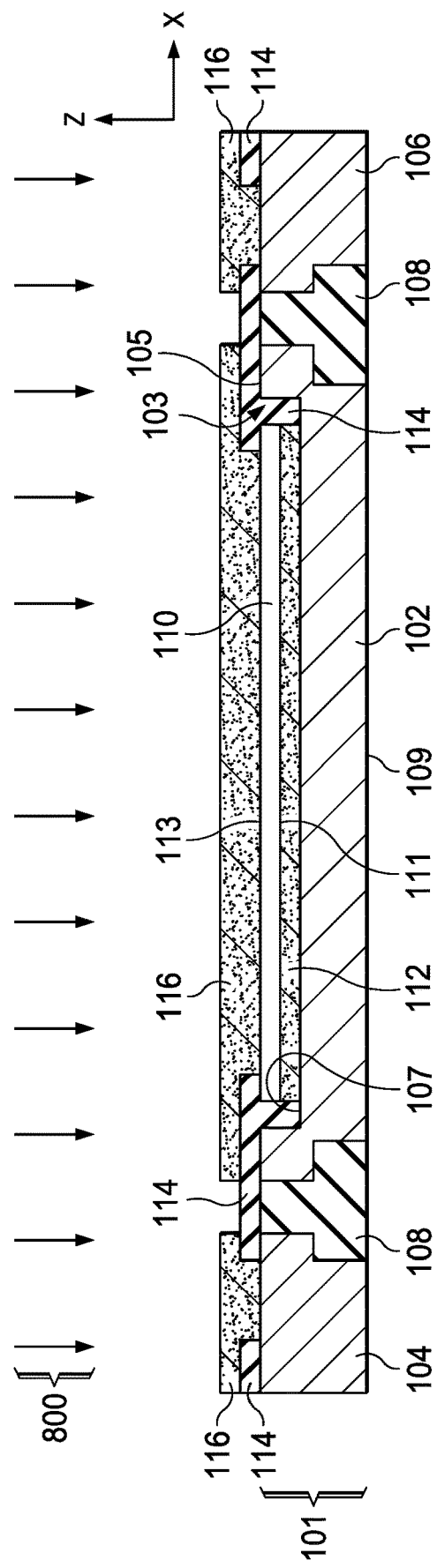

At 214 in FIG. 2, the method 200 further includes forming a first intermediate conductive epoxy on the upper second side of the first semiconductor die. Any suitable material formation processing can be used at 214, for example, printing, dispensing, silk screening, etc. FIG. 8 shows one example, in which a dispensing process 800 is performed that dispenses the first intermediate conductive epoxy 116 on select portions of the second side 113 of the first semiconductor die 110. In particular, the top second side 113 in one example includes a conductive feature electrically connected to the first drain terminal D1, and may include a separate conductive feature electrically connected to the first gate terminal G1 of the first transistor Q1 of the first semiconductor die 110. Where separate conductive terminals are formed on the second side 113, the dispensing process 800 forms corresponding separate portions of the first intermediate conductive epoxy 116 thereon. In the example of FIG. 8, the dispensing process 800 also dispenses separate portions of the first intermediate conductive epoxy 116 on the respective first and second conductive pads 104 and 106 for subsequent electrical connection.

Figure 9:
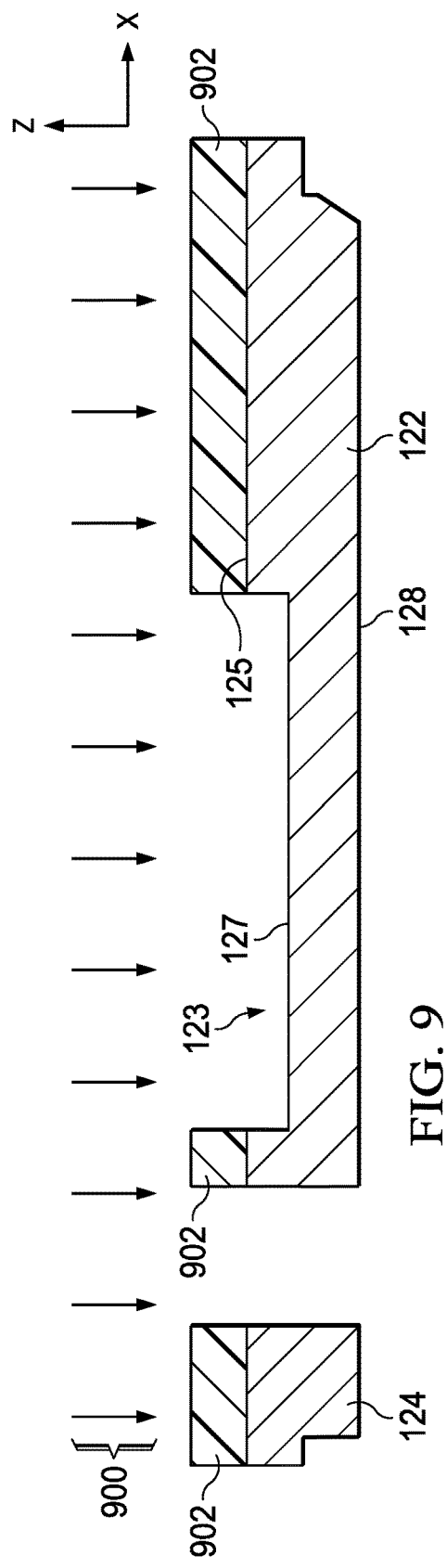

The example method 200 continues at 216-224 with separate processing to form the second subassembly 120 shown in FIG. 1. In this example, the second subassembly fabrication processing begins at 216 with plating and etching a second recess in a second conductive plate. Any suitable plating process can be used to form a desired plated surface on the pre-molded lead frame structure at 216. In another example, the plating process is omitted, and the second recess is formed at 216. FIG. 9 shows one suitable example, starting with a second conductive plate 122 and the conductive structure 124 spaced from one another in a predetermined spatial relationship, for example, on an adhesive carrier tape (not shown).

In the example of FIG. 9, a second etching process 900 is performed that etches the second recess 123 in the upper first side 125 of the second conductive plate 122 using a second etch mask 902. Any suitable etch process 900 and etching mask 902 can be used to form the second recess 123 at 216. In the illustrated example, the second bottom 127 of the second recess 123 is generally planar and the side walls of the second recess 123 are generally vertical (e.g., along the Z axis in FIG. 9), although these characteristics are not strict requirements of all possible implementations. A generally flat bottom 127 facilitates subsequent processing to form (e.g., dispense, print, silkscreen, etc.) a second conductive epoxy within the second recess 123 and die attach processing to locate a second semiconductor die at least partially within the recess 123 on the previously dispensed conductive epoxy.

At 218 in FIG. 2, the method 200 continues with forming a second conductive epoxy on the second bottom of the second recess. After the second conductive epoxy is formed, the method 200 includes attaching the first side of the second semiconductor die to the second conductive epoxy at 220. FIG. 10 shows one example, in which a printing and die attach process 1000 is performed that prints the second conductive epoxy 132 on at least a portion of the second bottom 127 of the second recess 123. Any suitable printing equipment and techniques can be used at 218. In another example, a dispensing process is used to form the second conductive epoxy 132 on the second bottom 127 of the second recess 123. In another example, a screening process is used to form the second conductive epoxy 132 on the second bottom 127 of the second recess 123. The example process 1000 in FIG. 10 also includes attaching the first side 131 of the second semiconductor die 130 to the second conductive epoxy 132 (at 220 in FIG. 2). In one example, the processing 1000 in FIG. 10 also includes a second thermal process that reflows the second conductive epoxy 132 (e.g., at 222 in FIG. 2) after attaching the first side 131 of the second semiconductor die 130 to the second conductive epoxy 132 at 220. In one example, the second conductive epoxy 132 is formed in a semi-solid state through dispensing, printing, silk screening, etc. Subsequent thermal processing at 222 in one example initially reflows the formed second conductive epoxy 132 and the heating and/or subsequent cooling of the material 132 cures the second conductive epoxy 132 to a solid state that mechanically and electrically connects at least a portion of the lower first side 131 of the second semiconductor die 130 to the second conductive plate 122.

In one example, the first side 131 of the second semiconductor die 130 includes a conductive feature electrically connected to the second transistor source terminal S2 (FIG. 1), as well as another conductive feature electrically connected to the second gate terminal G2. In this example, the die attach processing can include contemporaneous dispensing, printing, etc. of the second conductive epoxy 132 in separate areas to accommodate electrically separated connections for the second source terminal S2 and the second gate terminal G2, such as forming a first portion of the second conductive epoxy 132 on a corresponding conductive pad 152 (e.g., FIGS. 1 and 15) for the second gate terminal connection, and forming a second portion of the second conductive epoxy 132 on at least a portion of the second bottom 127 of the second recess 123 of the second conductive plate 122 for the second source terminal connection as shown in FIGS. 3-14. In one example, the thermal process at 222 cures the second conductive epoxy 132. The die attach processing at 220 and 222 electrically couples at least a portion of the first side 131 of the second semiconductor die 130 to the second bottom 127 of the second recess 123 of the second conductive plate 122.

The method 200 continues at 224 with forming a second insulating film on portions of the second conductive plate and the second semiconductor die. Any suitable material formation processing can be used at 224, for example, printing, dispensing, silk screening, etc. FIG. 11 shows one example, in which a second deposition process, such as a printing process 1100, is performed. The printing process 1100 deposits the second electrically insulating film 134 at least partially in the second recess 123 along the sidewalls of the second semiconductor die 130 and along a laterally peripheral portion of the upper second side 133 of the second semiconductor die 130. In another example, the printing process 1100 does not deposit the second electrically insulating film 134 on the upper second side 133 of the second semiconductor die 130. The illustrated example advantageously coats the peripheral edge of the upper second side 133 of the second semiconductor die 130, and helps to protect the die edges and prevent or mitigate epoxy overflow and associated short circuits in subsequent processing. In the example of FIG. 11, moreover, the process 1100 forms the second electrically insulating film 134 on the peripheral edges of the second side 133, and leaves one or more upper conductive features of the second semiconductor die 130 exposed for subsequent electrical connection (e.g., the second drain terminal D2 in FIG. 1).

Figure 12:
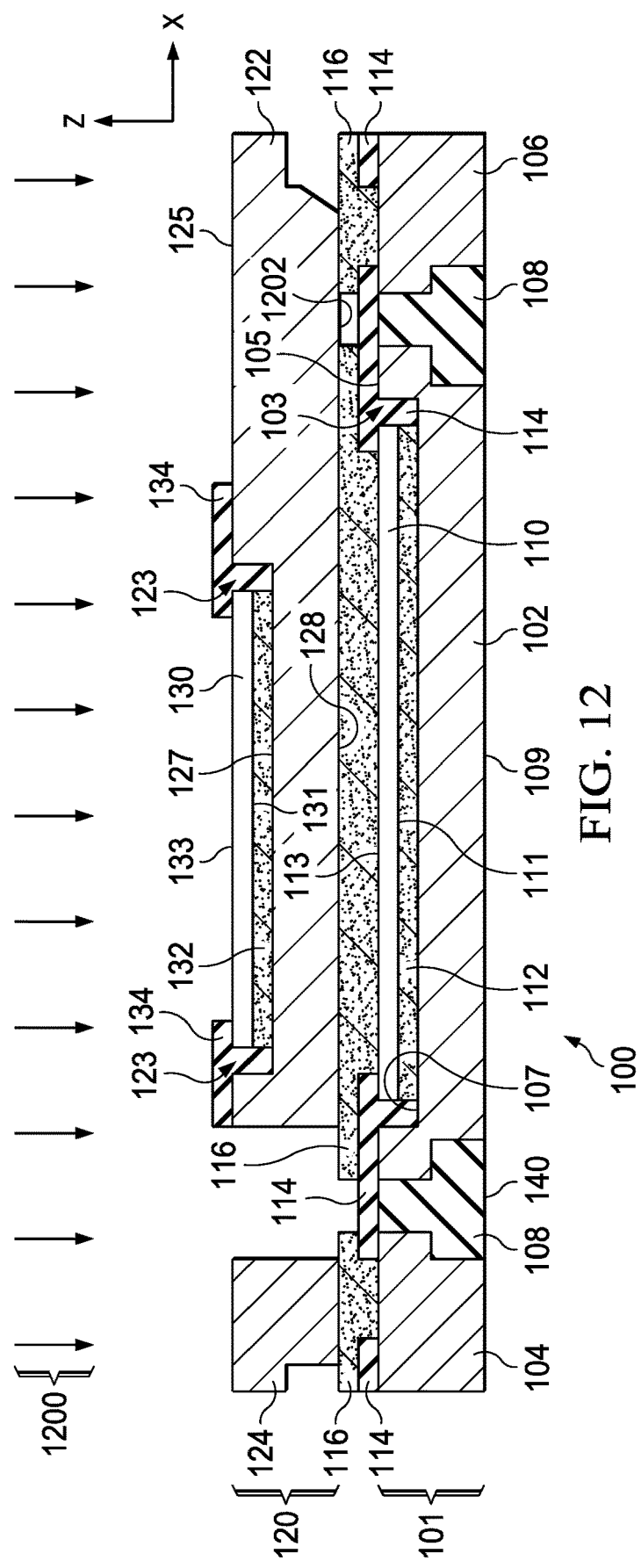

After the first and second subassemblies 101 and 120 are completed, the second subassembly 120 is assembled onto the first subassembly 101 at 226 in FIG. 2. FIG. 12 shows one example, in which an attachment process 1200 is performed (e.g., mechanical robotic pick and place) that attaches the second side 128 of the second conductive plate 122 to the first intermediate conductive epoxy 116. At 228, one example further includes performing a third thermal process that reflows and cures the first intermediate conductive epoxy 116 to complete the electrical coupling of the second side 128 of the second conductive plate 122 to the second side 113 of the first semiconductor die 110 at the switching node SW.

Figure 13:
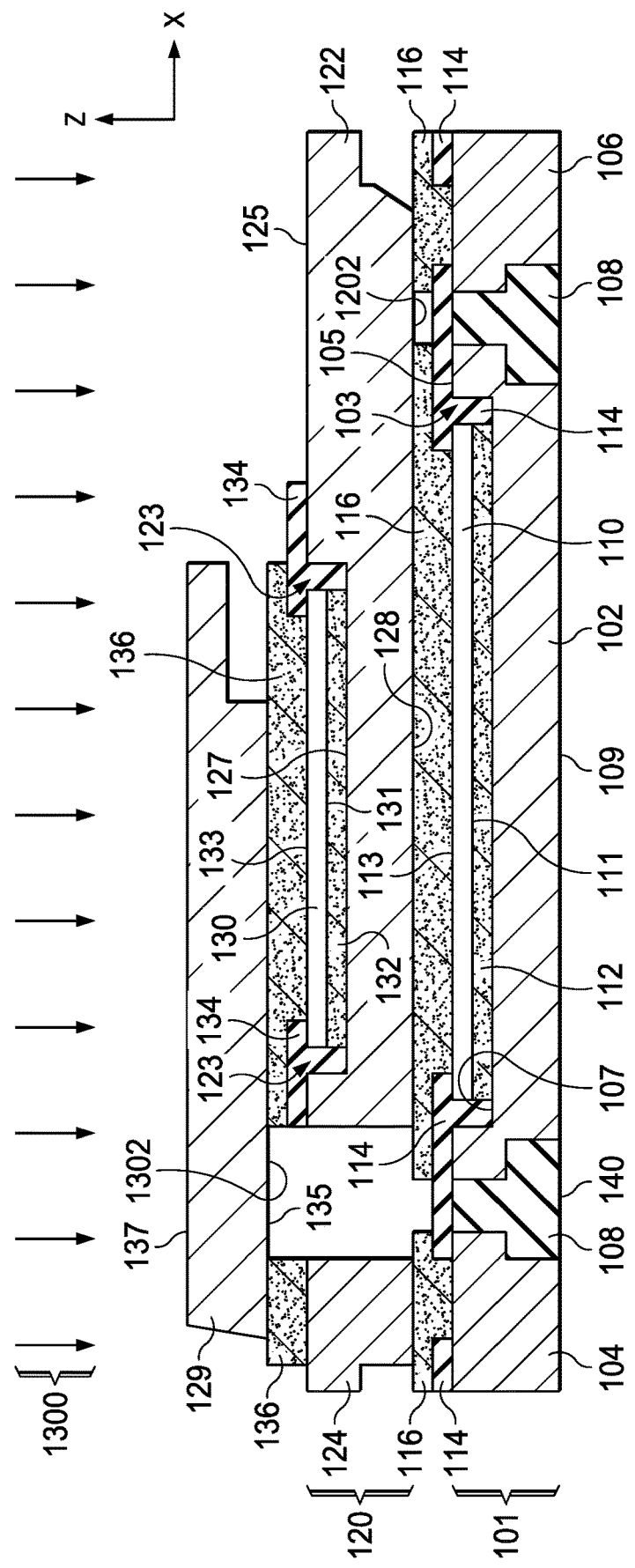
Figure 14:
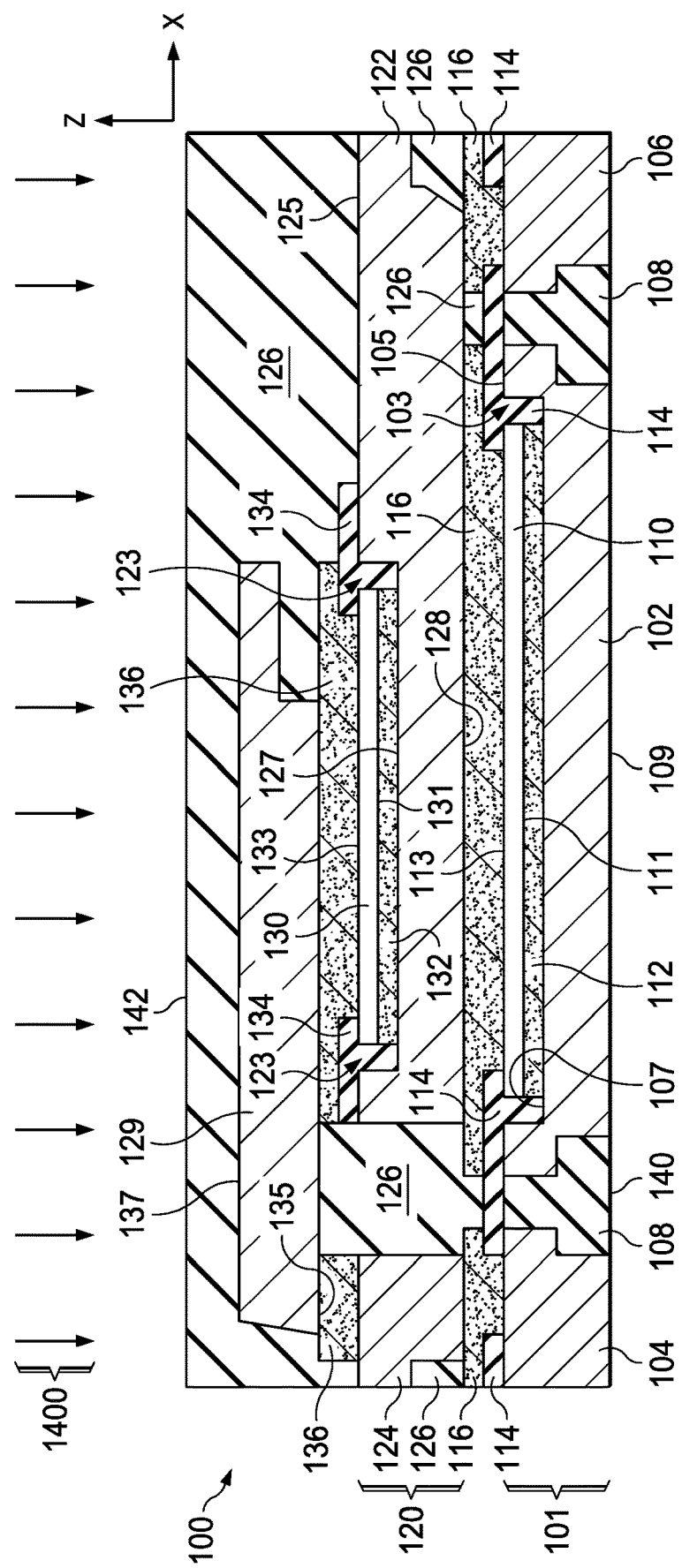

The method 200 at 230 further includes forming the second intermediate conductive epoxy 136 on the upper second side 133 of the second semiconductor die 130. FIG. 13 shows an example, in which a dispensing process 1300 is performed that dispenses the second intermediate conductive epoxy 136 on the upper second side 133 of the second semiconductor die 130. At 232, the method 200 further includes attaching the lower first side 135 of the third conductive plate 129 to the second intermediate conductive epoxy 136 to electrically couple the lower first side 135 of the third conductive plate 129 to the upper second side 133 of the second semiconductor die 130, as shown in FIG. 13. The method 200 continues at 234 with performing a fourth thermal process that reflows the second intermediate conductive epoxy 136. Wire bonding (not shown) can optionally be performed at 236, and a molding process is performed at 238. FIG. 14 shows one example, in which a molding process 1400 is performed that forms the package structure 126. The final molded package material 126 and the pre-molded material 108 form a molded package structure that encloses the first semiconductor die 110, and the second semiconductor die 130, and includes the lower side 140 that exposes a portion of the second side 109 of the first conductive plate 102 and the conductive pads 104 and 106 as shown in FIG. 14.

FIG. 15 shows a bottom view of the finished packaged electronic device 100, following package singulation at 240 in FIG. 2. The finished device 100 includes solderable conductive pads or features 102, 104, 106, 151 and 152 separated from one another by the pre-molded insulating material 108. As schematically shown in FIG. 1, the example device provides a stacked power circuit in a single package to facilitate construction of a buck converter or other switching circuit with two transistors connected in a half-bridge configuration.

Modifications are possible in the described embodiments, and other embodiments are possible, within the scope of the claims.

The invention claimed is:

1. A method, comprising:
   forming a first recess in a first side of a first conductive plate;
   forming a first conductive epoxy on a first bottom of the first recess;
   attaching a first side of a first semiconductor die to the first conductive epoxy to electrically couple the first side of the first semiconductor die to the first bottom of the first recess of the first conductive plate;
   forming a first intermediate conductive epoxy on a second side of the first semiconductor die;
   forming a second recess in a first side of a second conductive plate;
   forming a second conductive epoxy on a second bottom of the second recess;
   attaching a first side of a second semiconductor die to the second conductive epoxy to electrically couple the first side of the second semiconductor die to the second bottom of the second recess of the second conductive plate;
   attaching a second side of the second conductive plate to the first intermediate conductive epoxy to electrically couple the second side of the second conductive plate to the second side of the first semiconductor die;
   forming a second intermediate conductive epoxy on a second side of the second semiconductor die;
   attaching a first side of a third conductive plate to the second intermediate conductive epoxy to electrically couple the first side of the third conductive plate to the second side of the second semiconductor die; and performing a molding process that forms a package structure that encloses the first semiconductor die, and the second semiconductor die, the package structure including a side that exposes a portion of the second side of the first conductive plate.

2. The method of claim 1, further comprising:

after attaching the first side of the first semiconductor die to the first conductive epoxy, performing a first deposition process that deposits a first electrically insulating film at least partially in the first recess of the first conductive plate along a sidewall and a portion of the second side of the first semiconductor die; and after attaching the first side of the second semiconductor die to the second conductive epoxy, performing a second deposition process that deposits a second electrically insulating film at least partially in the second recess of the second conductive plate along a sidewall of the second semiconductor die.

3. The method of claim 2, wherein the first deposition process deposits the first electrically insulating film on a portion of the second side of the first semiconductor die; and wherein the second deposition process deposits the second electrically insulating film on a portion of the second side of the second semiconductor die.

4. The method of claim 2, further comprising:

after attaching the first side of the first semiconductor die to the first conductive epoxy, performing a first thermal process that reflows the first conductive epoxy;

after attaching the first side of the second semiconductor die to the second conductive epoxy, performing a second thermal process that reflows the second conductive epoxy;

after attaching the second side of the second conductive plate to the first intermediate conductive epoxy, performing a third thermal process that reflows the first intermediate conductive epoxy; and after attaching the first side of the third conductive plate to the second intermediate conductive epoxy, performing a fourth thermal process that reflows the second intermediate conductive epoxy.

5. The method of claim 1, further comprising:

after attaching the first side of the first semiconductor die to the first conductive epoxy, performing a first thermal process that reflows the first conductive epoxy;

after attaching the first side of the second semiconductor die to the second conductive epoxy, performing a second thermal process that reflows the second conductive epoxy;

after attaching the second side of the second conductive plate to the first intermediate conductive epoxy, performing a third thermal process that reflows the first intermediate conductive epoxy; and after attaching the first side of the third conductive plate to the second intermediate conductive epoxy, performing a fourth thermal process that reflows the second intermediate conductive epoxy.

6. The method of claim 1, wherein forming the first recess in the first side of the first conductive plate includes performing a first etch process that etches the first recess in the first side of the first conductive plate using a first mask; and wherein forming the second recess in the first side of the second conductive plate includes performing a second etch process that etches the second recess in the first side of the second conductive plate using a second mask.

7. A method of making a packaged electronic device, comprising:

providing a first conductive plate, including a first side, an opposite second side, and a first recess in the first side of the first conductive plate, the first recess including a first bottom;

providing a first semiconductor die, including a first side, and an opposite second side, the first side of the first semiconductor die electrically coupled to the first bottom of the first recess of the first conductive plate;

providing a second conductive plate, including a first side, an opposite second side, and a second recess in the first side of the second conductive plate, the second recess including a second bottom, the second side of the second conductive plate electrically coupled to the second side of the first semiconductor die;

providing a second semiconductor die, including a first side, and an opposite second side, the first side of the second semiconductor die electrically coupled to the second bottom of the second recess of the second conductive plate;

providing a third conductive plate, including a first side electrically coupled to the second side of the second semiconductor die; and providing a package structure that encloses the first semiconductor die, and the second semiconductor die, the package structure including a side that exposes a portion of the second side of the first conductive plate.

8. The method of claim 7, further comprising:

providing a first electrically insulating film located at least partially in the first recess of the first conductive plate along a sidewall and a portion of the second side of the first semiconductor die; and providing a second electrically insulating film located at least partially in the second recess of the second conductive plate along a sidewall of the second semiconductor die.

9. The method of claim 8, wherein the first electrically insulating film is located on the portion of the second side of the first semiconductor die; and wherein the second electrically insulating film is located on a portion of the second side of the second semiconductor die.

10. The method of claim 9, further comprising:

providing a first conductive epoxy in the first recess between the first side of the first semiconductor die and the first bottom of the first recess of the first conductive plate; and providing a second conductive epoxy in the second recess between the first side of the second semiconductor die and the second bottom of the second conductive plate.

11. The method of claim 8, further comprising:

providing a first conductive epoxy in the first recess between the first side of the first semiconductor die and the first bottom of the first recess of the first conductive plate; and providing a second conductive epoxy located in the second recess between the first side of the second semiconductor die and the second bottom of the second conductive plate.

12. The method of claim 11, further comprising:

electrically coupling a first conductive pad to the third conductive plate; and electrically coupling a second conductive pad to the second conductive plate;

wherein the package structure exposes a portion of a side of the first conductive pad, and the package structure exposes a portion of a side of the second conductive pad.

13. The method of claim 7, further comprising:

providing a first conductive epoxy in the first recess between the first side of the first semiconductor die and the first bottom of the first recess of the first conductive plate; and providing a second conductive epoxy in the second recess between the first side of the second semiconductor die and the second bottom of the second conductive plate.

14. The method of claim 13, further comprising:

electrically coupling a first conductive pad to the third conductive plate; and electrically coupling a second conductive pad to the second conductive plate;

wherein the package structure exposes a portion of a side of the first conductive pad, and the package structure exposes a portion of a side of the second conductive pad.

15. The method of claim 7, further comprising:

electrically coupling a first conductive pad to the third conductive plate; and electrically coupling a second conductive pad to the second conductive plate;

wherein the package structure exposes a portion of a side of the first conductive pad, and the package structure exposes a portion of a side of the second conductive pad.

16. A method for making a packaged switching circuit, comprising:

providing a first semiconductor die, including:
a first transistor, including: a first source terminal, a first drain terminal, and a first gate terminal,
a first side electrically coupled to the first source terminal and to a first bottom of a first recess of a first conductive plate, and
an opposite second side electrically coupled to the first drain terminal and to a second conductive plate;

providing a second semiconductor die, including:
a second transistor, including: a second source terminal, a second drain terminal, and a second gate terminal,
a first side electrically coupled to the second source terminal and to a second bottom of a second recess of the second conductive plate, and
an opposite second side, the second side of the second semiconductor die electrically coupled to the second drain terminal and to a first side of a third conductive plate;

electrically coupling a first conductive pad to the third conductive plate;

electrically coupling a second conductive pad to the second conductive plate;

electrically coupling a third conductive pad to the first gate terminal;

electrically coupling a fourth conductive pad to the second gate terminal; and providing a package structure that encloses the first semiconductor die, and the second semiconductor die, the package structure including a side that exposes respective portions of: the first conductive pad, the second conductive pad, the third conductive pad, the fourth conductive pad, and the second side of the first conductive plate.

17. The method of claim 16, further comprising:

providing a first electrically insulating film located at least partially in the first recess of the first conductive plate along a sidewall and a portion of the second side of the first semiconductor die; and providing a second electrically insulating film located at least partially in the second recess of the second conductive plate along a sidewall of the second semiconductor die.

18. The method of claim 17, wherein the first electrically insulating film is located on the portion of the second side of the first semiconductor die; and wherein the second electrically insulating film is located on a portion of the second side of the second semiconductor die.

19. The method of claim 17, further comprising:

providing a first conductive epoxy in the first recess between the first side of the first semiconductor die and the first bottom of the first recess of the first conductive plate; and providing a second conductive epoxy in the second recess between the first side of the second semiconductor die and the second bottom of the second conductive plate.

20. The method of claim 16, further comprising:

providing a first conductive epoxy in the first recess between the first side of the first semiconductor die and the first bottom of the first recess of the first conductive plate; and providing a second conductive epoxy located in the second recess between the first side of the second semiconductor die and the second bottom of the second conductive plate.

* * * * *